United States Patent [19]
Nagayama

[11] Patent Number: 4,789,832
[45] Date of Patent: Dec. 6, 1988

[54] THREE-DIMENSIONAL NMR SPECTROSCOPY

[75] Inventor: Kuniaki Nagayama, Akishima, Japan

[73] Assignee: Jeol Ltd., Tokyo, Japan

[21] Appl. No.: 143,576

[22] Filed: Jan. 12, 1988

[30] Foreign Application Priority Data

Jan. 14, 1987 [JP] Japan .................. 62-7779
Jan. 14, 1987 [JP] Japan .................. 62-7780

[51] Int. Cl.$^4$ ........................... G61R 33/20
[52] U.S. Cl. ....................... 324/312; 324/307
[58] Field of Search ............. 324/307, 309, 312, 310, 324/311, 314, 308

[56] References Cited

U.S. PATENT DOCUMENTS

| | | | |
|---|---|---|---|
| 4,134,058 | 1/1979 | Ernst .................. | 324/307 |
| 4,510,449 | 4/1985 | Ernst et al. .............. | 324/307 |
| 4,513,247 | 4/1985 | Ernst .................. | 324/309 |
| 4,520,316 | 5/1985 | Hall et al. .............. | 324/309 |
| 4,626,783 | 12/1986 | Ohuchi .................. | 324/310 |
| 4,703,270 | 10/1987 | Hall et al. .............. | 324/309 |

Primary Examiner—Michael J. Tokar
Assistant Examiner—Kevin D. O'Shea
Attorney, Agent, or Firm—Webb, Burden, Ziesenheim & Webb

[57] ABSTRACT

A three-dimensional NMR spectroscopy capable of obtaining a plurality of two-dimensional NMR spectra by a single series of measurements. In this spectroscopy, a pulse sequence consisting of three 90°-pulses and a 180°-pulse is utilized. The three 90°-pulses are produced at intervals. The interval between the second and the third 90°-pulses is set to $\tau_m$. The 180°-pulse is produced at the middle of the interval $\tau_m$. In a first embodiment of the invention, the interval $t_1$ between the first and the second 90°-pulses and the RF phases $\phi$ of the first and second 90°-pulses and of the 180°-pulse are taken as variables. The free induction decay signals produced after the lapse of a period of $t_2$ subsequent to the third 90°-pulse are collected to create data $S(t_1, t_2, \phi)$. In a second embodiment of the invention, the intervals $t_1$ and $\tau_m$ are taken as variables, $\tau_m$ being rewritten as $t_3$. The free induction decay signals produced during the period $t_2$ are collected to create data $S(t_1, t_2, t_3)$. The data of either kind is subjected to complex Fourier transformation with respect to $t_1$ and $t_2$ and then to cosine Fourier transformation with respect to $\phi$ or $t_3$ to obtain a three-dimensional NMR spectrum $S(\omega_1, \omega_2, p)$ or $S(\omega_1, \omega_2, J)$ made up of plural 2D NMR spectra.

3 Claims, 8 Drawing Sheets

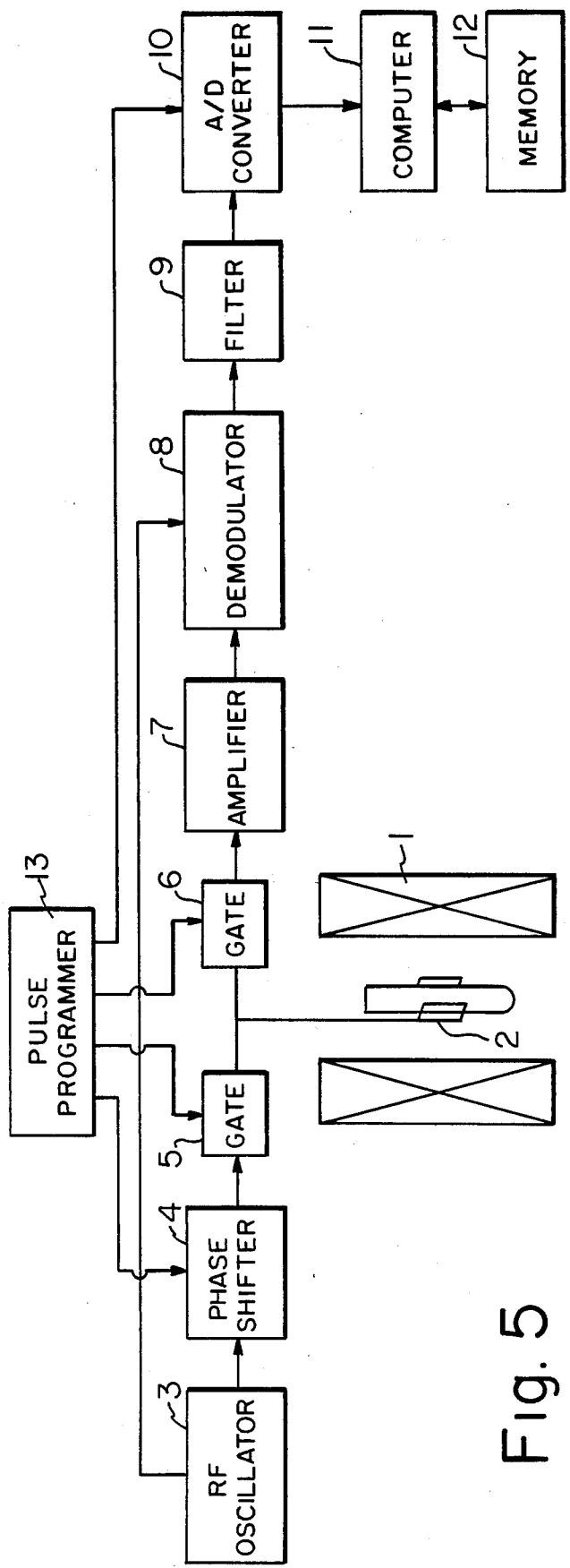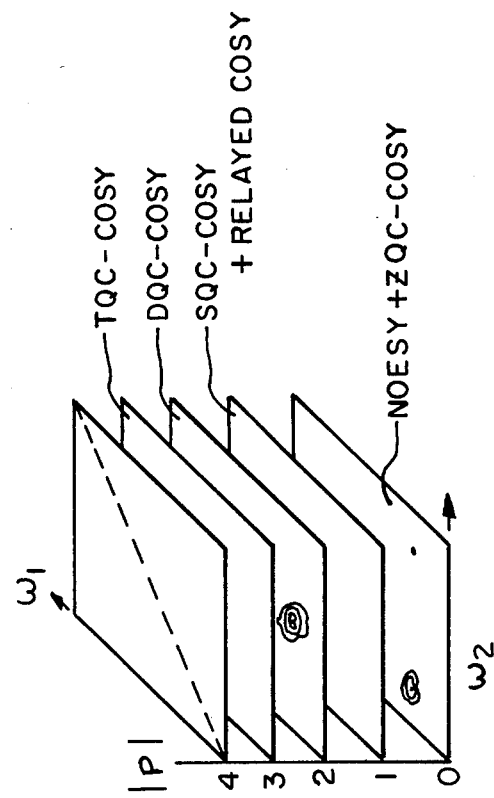
Fig. 5
Fig. 7

THREE-DIMENSIONAL NMR SPECTROSCOPY

BACKGROUND OF THE INVENTION

The present invention relates to a three-dimensional NMR (nuclear magnetic resonance) spectroscopy.

FIG. 1 shows a one-dimensional (1D) NMR spectrum of oxytocin. This spectrum contains various kinds of information including intensities, chemical shifts, coupling constants, multiplicity, and line widths, and these kinds of information are mixed together in a quite complex manner. In order to separate these kinds of information, complicated spectral analysis is needed.

Two-dimensional (2D) NMR spectroscopies have been evolved to solve the above-described problem with the 1D NMR spectroscopy. Generally, a 2D NMR spectroscopy yields a higher resolution and makes it easier to analyze spectra than the prior art method. Further, the 2D spectroscopy enables elucidation of nuclear spin-spin interactions, and offers other advantages.

The 2D NMR spectroscopy which was first introduced was correlation spectroscopy (COSY) using two 90°-pulses. Today, the concept of 2D NMR spectroscopy has been extended to NOE spectroscopy (NOESY), multiple-quantum filtering-correlation spectroscopy (MQF-COSY), spin echo spectroscopy (SECSY), H-C COSY, and other 2D techniques using three or four pulses. FIG. 2 shows the manner in which these 2D NMR techniques have evolved.

FIG. 3 shows pulse sequences used in these 2D NMR techniques. FIG. 3(a) shows a pulse sequence used for COSY. FIG. 3(b) shows a pulse sequence used for SECSY. FIG. 3(c) shows a pulse sequence used for MQF-COSY. FIG. 3(d) shows a pulse sequence used for NOESY. When homonuclear species are observed, the number of pulses of such a pulse sequence can be increased up to four.

A typical process of measurement performed by 2D NMR spectroscopy is next described by referring to FIG. 4(a), where a pulse sequence using three 90°-pulses is employed. A first experiment consists of four periods, i.e., a preparation period of $\tau_p$ for maintaining the nuclear magnetization in its appropriate initial condition before the application of a first 90°-pulse, an evolution period of $t_1$ between the first 90°-pulse and a second 90°-pulse, a fixed mixing period of $\tau_m$ between the second 90°-pulse and a third 90°-pulse and a detection period of $t_2$ subsequent to the third 90°-pulse, or detection pulse. The phase and the amplitude of a free induction decay (FID) signal which is detected during the detection period of $t_2$ reflects the behavior of the magnetization in the evolution period $t_1$, which is separated from the detection period of $t_2$ by the mixing period of $\tau_m$.

The obtained data is given by S ($t_1$, $t_2$), where $t_1$ and $t_2$ are variables. The data is expressed in the form of a two-dimensional matrix. The nuclear magnetization evolves at resonant frequencies $\omega^{(1)}_{rs}$ and $\omega^{(2)}_{tu}$ during the period $t_1$ and $t_2$, respectively. Information about the magnetization existing during $t_1$ is coupled to information about the magnetization existing during $t_2$, by the pulse applied during the mixing period. The degree of coupling depends upon the pulse or pulse train constituting the mixing period. The action of the pulse or pulse train is mathematically expressed by various rotation operators R. The matrix elements $R_{rs,tu}$ of such a rotation operator represent intensities at positions $\omega^{(1)}_{rs}$, $\omega^{(2)}_{tu}$ in a 2D spectrum. This is shown in FIG. 4(b), where the vertical and the horizontal axes express $\omega_1$ and $\omega_2$, respectively.

When this 2D NMR spectroscopy is employed, a measurement must be repeated many times with different values of $t_1$. Since the accumulation technique that is conventionally used to enhance the signal-to-noise ratio is also utilized, the time actually taken for a series of measurements reaches several hours to tens of hours.

The present situation is that where organic substances are investigated by 2D NMR spectroscopy, almost all of the aforementioned 2D NMR techniques are utilized to make the spectral assignment. Therefore, a different kind of pulse train must be used to obtain a different kind of information. Of course, these different kinds of measurements are carried out at different instants of time, even on different days. Consequently, it is inevitable that the observational environment, including the conditions of the NMR spectrometer used, varies among individual measurements. Also, when an unstable substance undergoes investigation, the substance may decompose while a series of measurements is being conducted. In this way, it is impossible to obtain every 2D NMR spectrum from the sample under the same conditions. For this reason, the results of analysis derived by combining various 2D NMR spectra involve error or some degree of ambiguity.

SUMMARY OF THE INVENTION

It is a main object of the present invention to provide a three-dimensional (3D) NMR spectroscopy which makes it possible to obtain a plurality of two-dimensional (2D) NMR spectra by making only a single series of NMR experiments.

The novel 3D NMR spectroscopy according to the invention makes use of a pulse sequence essentially consisting of three 90°-pulses which are caused to irradiate a sample at intervals of time. A 180°-pulse is caused to irradiate a sample at the middle of the interval between the second and the third 90°-pulses.

In one embodiment of the invention, the interval $t_1$ between first and second 90°-pulses and the phase $\phi$ of the first and second 90°-pulses and of a 180°-pulse are taken as variables. A series of measurements is performed while varying the values of $t_1$ and $\phi$ systematically. The resulting data is given by S ($t_1$, $t_2$, $\phi$). The data S ($t_1$, $t_2$, $\phi$) is subjected to complex double Fourier transformation with respect to $t_2$ and $t_1$. Then, the transformed data is subjected to cosine Fourier transformation with respect to $\phi$. As a result, we obtain 3D NMR data S ($\omega_1$, $\omega_2$, p).

According to this embodiment, it is possible to obtain a 3D NMR spectrum containing information about three types of spectra with a single series of NMR experiments. One of these three types of spectra is the superimposition of spectra respectively derived by SQC (single-quantum coherence)-COSY and relayed COSY. Another is the superimposition of spectra respectively provided by NOESY and ZQC (zero-quantum coherence)-COSY. The remaining one is a spectrum produced by MQC (multiple-quantum coherence)-COSY.

In a second embodiment of the invention, the interval $t_1$ between first and second 90°-pulses and the interval $t_3$ between the second and a third 90°-pulses are taken as variables. A series of measurements are performed while varying the values of $t_1$ and $t_3$ systematically. The resulting data is given by S ($t_1$, $t_2$, $t_3$). The data S ($t_1$, $t_2$, $t_3$) is subjected to complex double Fourier transformation with respect to $t_2$ and $t_1$ and then to cosine Fourier transformation with respect to $t_3$. As a result, 3D NMR data S ($\omega_1$, $\omega_2$, J) is obtained.

According to this second embodiment, a 3D NMR spectrum containing information about three types of spectra can be obtained with a single series of NMR experiments. One of these three types of spectra is a spectrum derived by COSY. Another is the superimposition of spectra respectively produced by NOESY and ZQC-COSY. The remaining one is a spectrum obtained by 2D J-resolved spectroscopy.

BRIEF DESCRIPTION OF THE DRAWINGS

FIG. 5 is a block diagram of an NMR spectrometer for executing a 3D NMR method according to the invention;

FIG. 7 is a diagram schematically showing a 3D NMR spectrum obtained by the first embodiment of the invention;

DETAILED DESCRIPTION OF THE INVENTION

Figure 1:
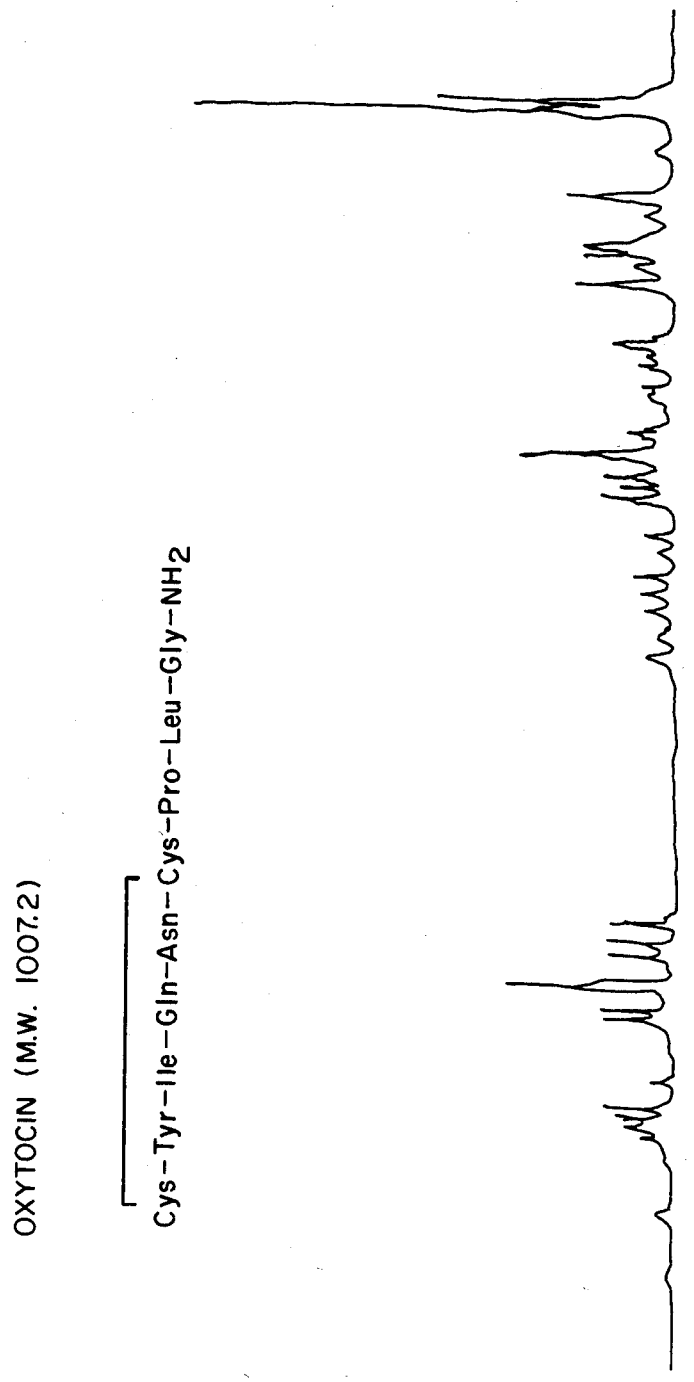
FIG. 1 is a diagram showing a one-dimensional NMR spectrum of oxytocin, and in which the assignments of the peaks are given (illustrative of prior art techniques)
Figure 2:
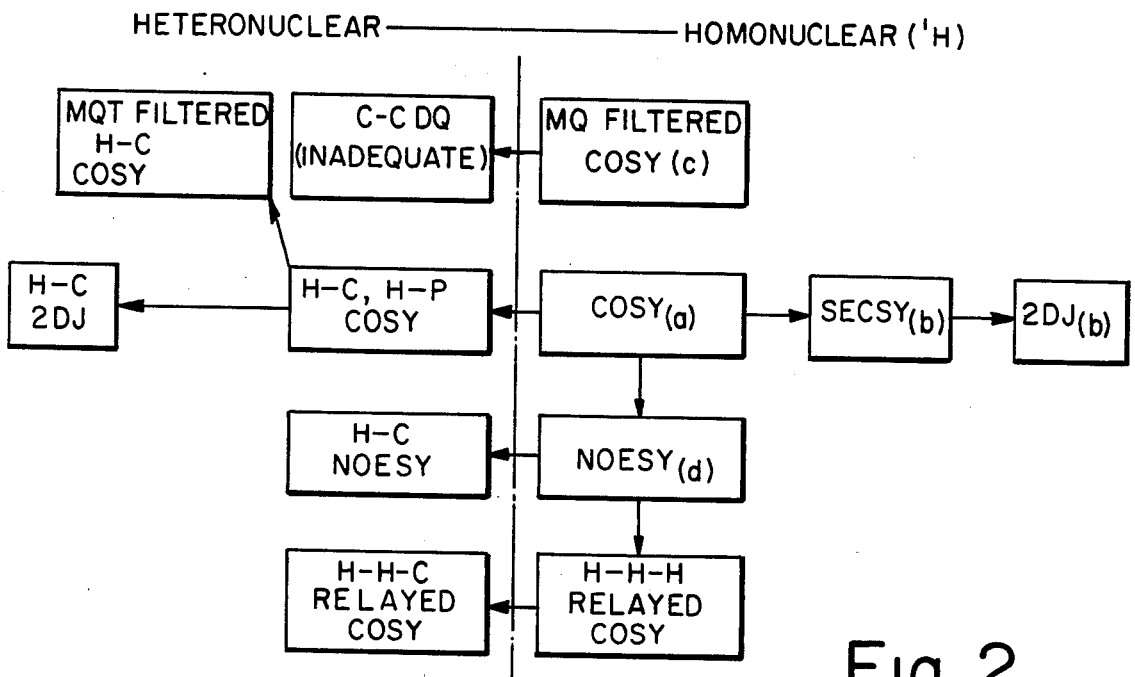
FIG. 2 is a diagram for illustrating the manner in which various prior art 2D NMR techniques have evolved.
Figure 3A:
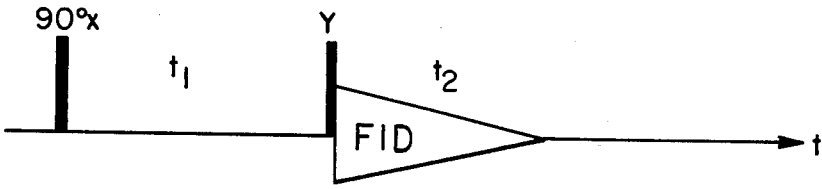
FIGS. 3(a)–3(d) show pulse sequences used for various prior art 2D NMR techniques.
Figure 3B:
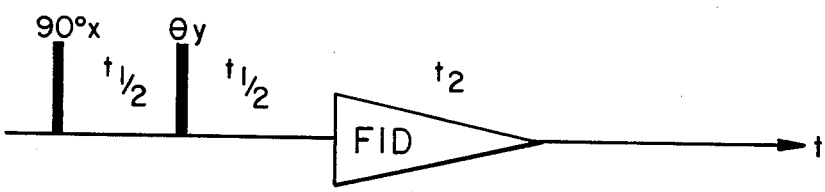
Figure 3C:
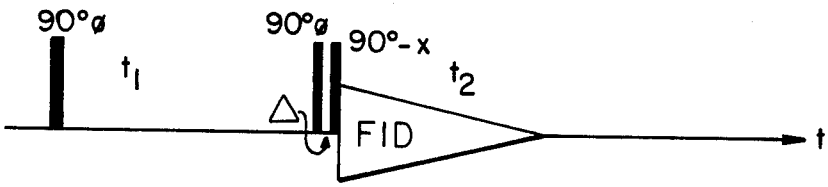
Figure 3D:
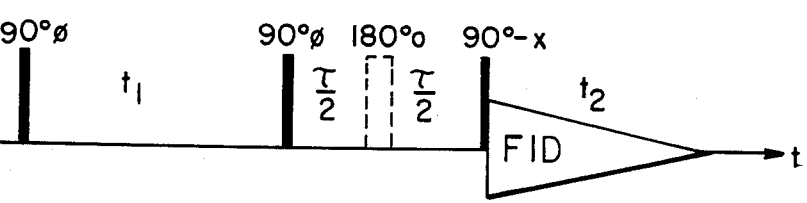
Figure 4A:
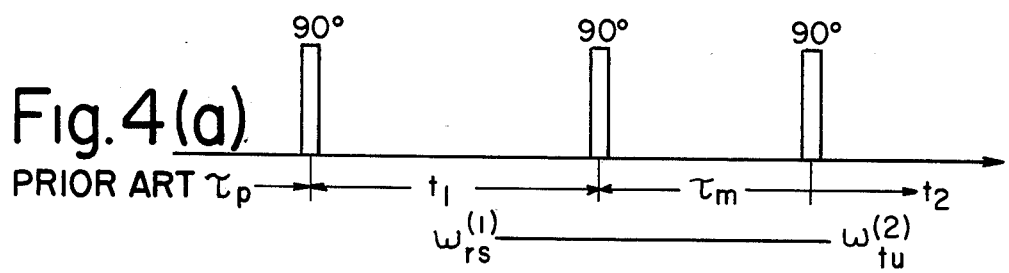
FIG. 4(a) shows a pulse sequence for illustrating the general process of measurement performed by prior art 2D NMR spectroscopy.
Figure 4B:
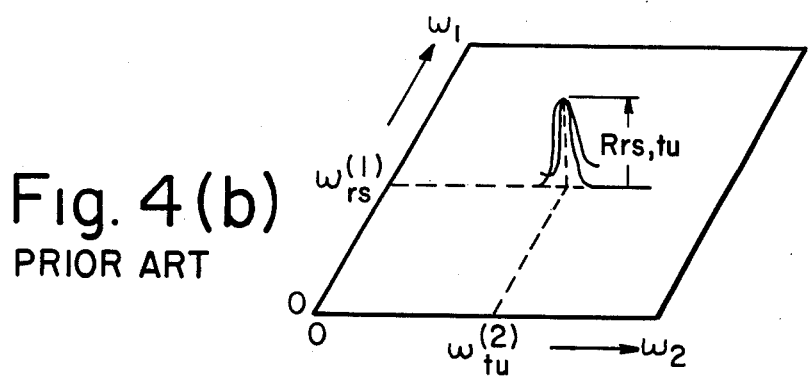
FIG. 4(b) shows a 2D NMR spectrum.

Three-dimensional (3D) NMR spectroscopy involves three time domain variables. In 3D NMR spectroscopy the obtained data is represented in the form of a three-dimensional matrix. Therefore, if variables are set without due consideration, an exorbitantly large storage capacity of memory is needed to store data.

In accordance with the present invention, the fundamental experiment giving rise to NMR data makes use of a so-called spin echo pulse train consisting of a 90°-pulse, a 180°-pulse, and a 90°-pulse in the mixing period. The 180°-pulse is applied at the middle of the mixing period. The application of this pulse train limits the frequency range over which the resulting 3D NMR spectrum spreads to a relatively narrow range. This permits the 3D NMR data to be stored in a memory of a relatively small storage capacity.

Referring to FIG. 5, there is shown an NMR spectrometer for executing the 3D NMR spectroscopy according to the invention. This spectrometer includes a magnet 1 that produces a static magnetic field in which a transmitter-receiver coil 2 is placed. An RF oscillator 3 produces RF waves including the resonance frequency of the nucleus to be observed. The RF waves are supplied as an RF pulse train to the coil 2 via a phase shifter 4 and a gate 5 and then applied to a sample.

The pulse duration of each pulse is appropriately set by adjusting the period during which the gate 5 is enabled, in order to produce 90°-pulses that rotate the magnetization of the nucleus under observation through 90°, as well as a 180°-pulse which rotates the magnetization through 180°. These pulses are set up at adequate intervals of time to generate a pulse train. The RF phase of each pulse can be set at will by the use of the phase shifter 4.

After the sample is irradiated with such a pulse train, a free induction decay (FID) signal is induced in the coil 2 and supplied to a demodulator circuit 8 via a gate 6 and an amplifier 7. The output signal from the demodulator circuit 8 is furnished via a filter 9 and an analog-to-digital converter 10 to a computer 11 having a memory 12 in which the data is stored. The phase shifter 4, the gates 6 and 7 and the A/D converter 10 operate under the control of a pulse programmer 13.

Figure 6A:
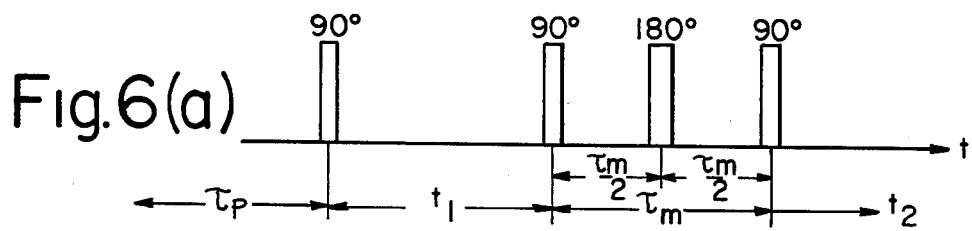
FIG. 6(a) shows a fundamental pulse sequence for use in the invention.

FIG. 6(a) shows the fundamental pulse sequence used in the present invention. A first 90°-pulse is applied subsequent to a preparation period of $\tau_p$. After an evolution period of $t_1$ elapses, a second 90°-pulse is applied, followed by a mixing period of $\tau_m$. Thereafter, a third 90°-pulse is applied. As already described, a spin echo pulse, or 180°-pulse, is applied at the middle of the mixing period $\tau_m$, i.e., at the instant when $\tau_m/2$ elapses after the application of the second 90°-pulse, to suppress the frequency widening due to chemical shifts.

Figure 6B:
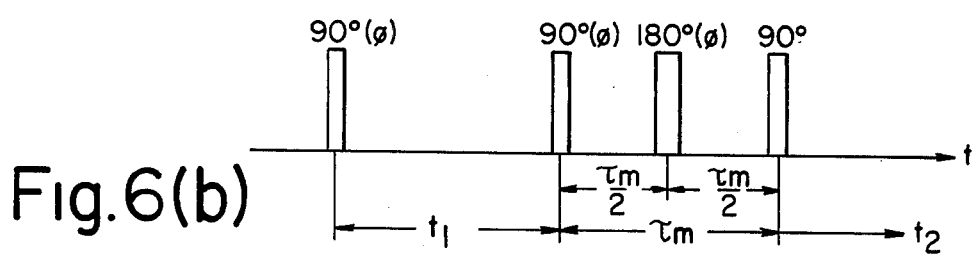
FIG. 6(b) shows a pulse sequence used in a first embodiment of the invention.

FIG. 6(b) shows a pulse sequence used in a first embodiment according to the invention. In the first embodiment, the RF phase of the first and second 90°-pulses and of the 180°-pulse of the four pulses is taken as a variable $\phi$ against the phase of the third 90°-pulse which is kept constant, and the phase $\phi$ is systemically changed, the magnitude of the p-quantum coherence that evolves during the mixing period of $\tau_m$ varies. That is, 2D NMR data S ($t_1$, $t_2$) that is obtained during the detection period of $t_2$ by changing the value of $t_1$ is given by $$S(t_1, t_2) = \sum_{p=-n}^{n} S_p(t_1, t_2) \tag{1}$$

By changing the value of the added $\phi$, we obtain 3D NMR data S ($t_1$, $t_2$, $\phi$) given by $$S(t_1, t_2, \phi) = \sum_{p=-n}^{n} e^{ip\phi} S_p(t_1, t_2) \tag{2}$$

Because the sign given to p is usually neglected, i.e., $S_p(t_1, t_2) = S_{-p}(t_1, t_2)$, the formula (2) is changed into the form $$S(t_1, t_2, \phi) = \sum_{p=0}^{n} \cos(p\phi) \cdot S_p(t_1, t_2) \tag{3}$$

In Fourier transformation, time t is conjugate to frequency $\omega$, while phase $\phi$ is conjugate to quantum number p. Therefore, a quantum-number spectrum is obtained by taking the Fourier transform of data in the phase domain, similarly to the case where a frequency spectrum is derived by taking the Fourier transform of data in the time domain. Since the value of p is an integer, $S_p(t_1, t_2)$ is represented for each individual value of p in practice. Then, 2D NMR spectra resolved by the quantum number are obtained.

Since the sign of p is neglected as described above, the formula (3) can be rewritten into the form $$S_p(t_1, t_2) = \sum_\phi S(t_1, t_2, \phi) \cos(p\phi) \quad (4)$$

Eventually, $S_p(t_1, t_2)$ is derived by taking the real Fourier transform, or cosine transform, of $S(t_1, t_2, \phi)$ with respect to $\phi$.

An algorithm by which a 3D NMR spectrum is obtained is given by $$S(t_1,t_2,\phi) \xrightarrow{t_2\text{-complex FT}} S(t_1,\omega_2,\phi) \xrightarrow{t_1\text{-complex FT}}$$

$$S(\omega_1,\omega_2,\phi) \xrightarrow{\phi\text{-cosine Trans.}} S(\omega_1,\omega_2,p)$$

That is, complex Fourier transformations are performed with respect to $t_1$ and $t_2$, in the same way as in the conventional 2D NMR spectroscopy. A cosine transformation is effected with respect to $\phi$.

FIG. 7 schematically shows a 3D spectrum based upon a 3D matrix of data obtained by the above-described processings. In this 3D spectrum, a plurality of 2D NMR spectra which are expressed on their respective $\omega_1$–$\omega_2$ planes are stacked along the p-axis extending vertically. A spectrum which is the superimposition of spectra respectively derived by SQC-COSY and relayed COSY is obtained by taking the plane with p=1 from the 3D spectrum. A spectrum that is the superimposition of spectra respectively provided by NOESY and ZQC-COSY is obtained by taking the plane p=0 from the 3D spectrum. The plane with p=2 corresponds to a spectrum obtained by DQC (double-quantum coherence)-COSY. The plane with p=3 corresponds to a spectrum derived by TQC (triple-quantum coherence)-COSY.

In the case of protons, if the quantum number p is assumed to take values up to 6 or so, then satisfactory results will be obtained. Therefore, if the number N of the sampling points, i.e., the number of increments of $\phi$, is 16 to 32, then satisfactory outcome will take place. If so, the number of stacked 2D spectra is half the number N, i.e., 8 to 16, according to the Nyquist theorem.

Since the number of sampling points is limited as mentioned above, the time taken to conduct cosine Fourier transformation with respect to $\phi$ cannot be reduced greatly by using an algorithm for fast Fourier transform. Where such an algorithm is not used, the sampling number N is not limited to power of 2 but can be selected at will.

FIGS. 8-11 show 2D spectra taken from a 3D NMR spectrum of oxytocin. A series of measurements was made while varying the value of the phase $\phi$ under the condition $p_{max}=3$. The Nyquist theorem requires that the sampling number N be equal to $p_{max} \times 2 = 6$. During the series of measurements, the phase $\phi$ assumed six values, i.e., 0°, 60°, 120°, 180°, 240°, and 300°. That is, the value of the phase $\phi$ was changed by 60° for every successive measurement. The value of $\tau_m$ was maintained at 50 ms.

Figure 8:
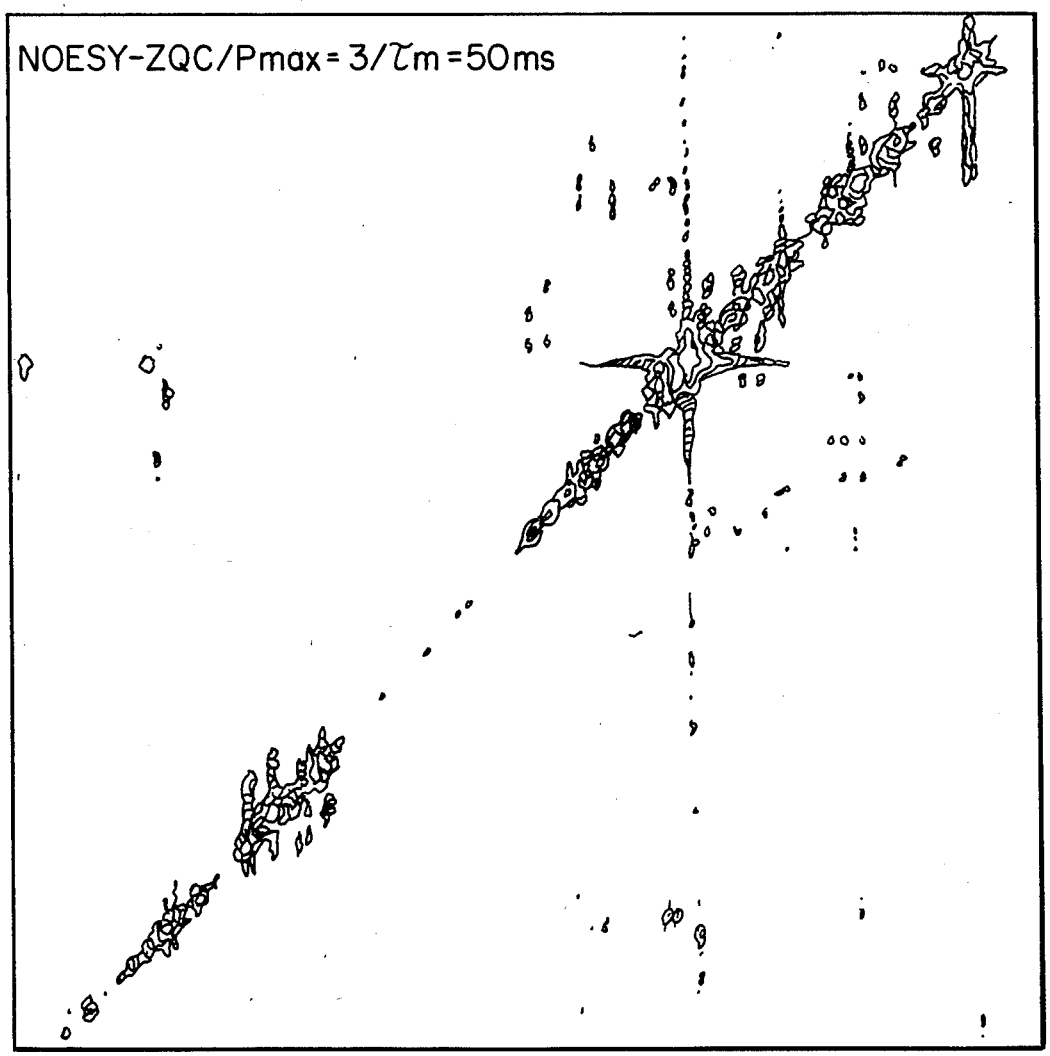
FIGS. 8–11 show 2D NMR spectra taken from a 3D NMR spectrum which was derived from oxytocin by the first embodiment of the invention.
Figure 9:
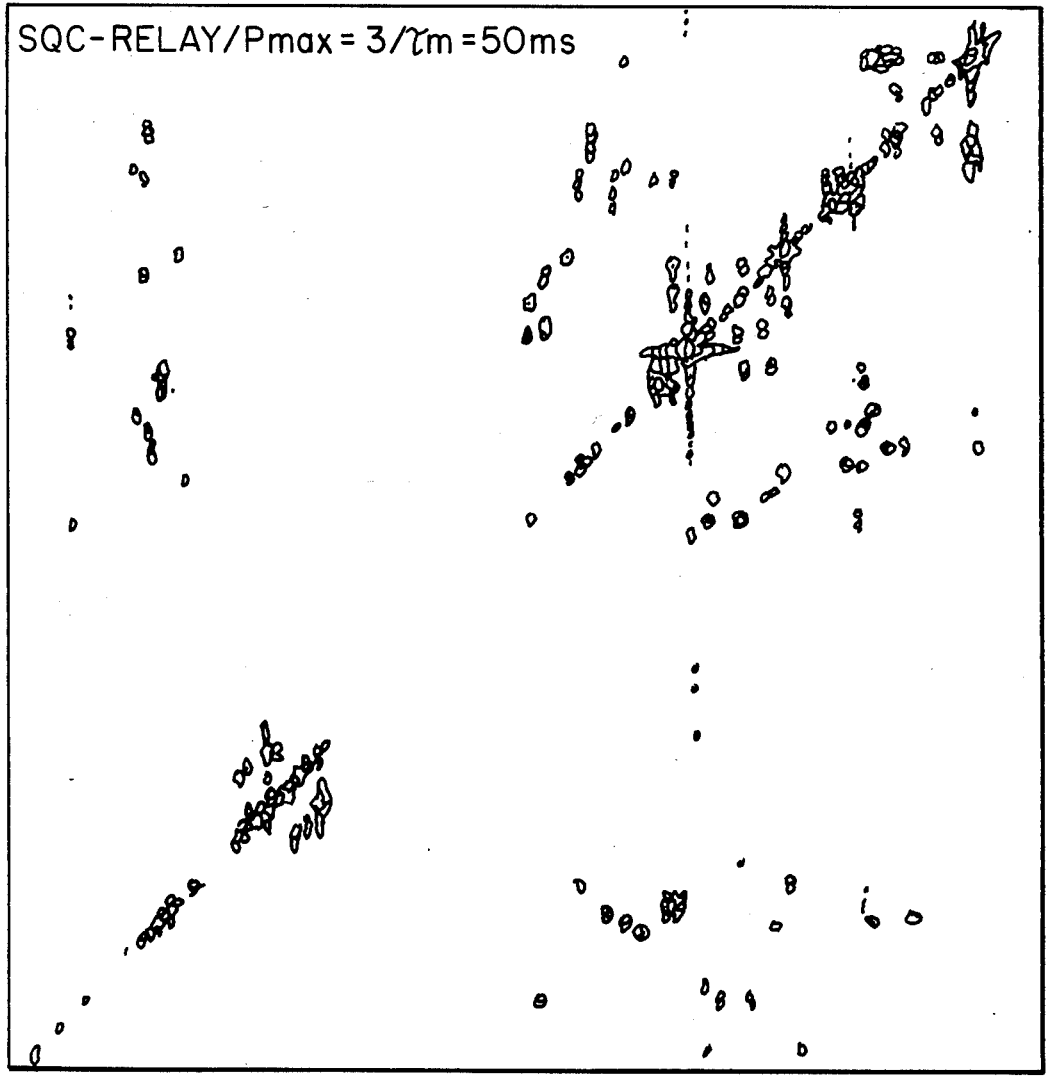
Figure 10:
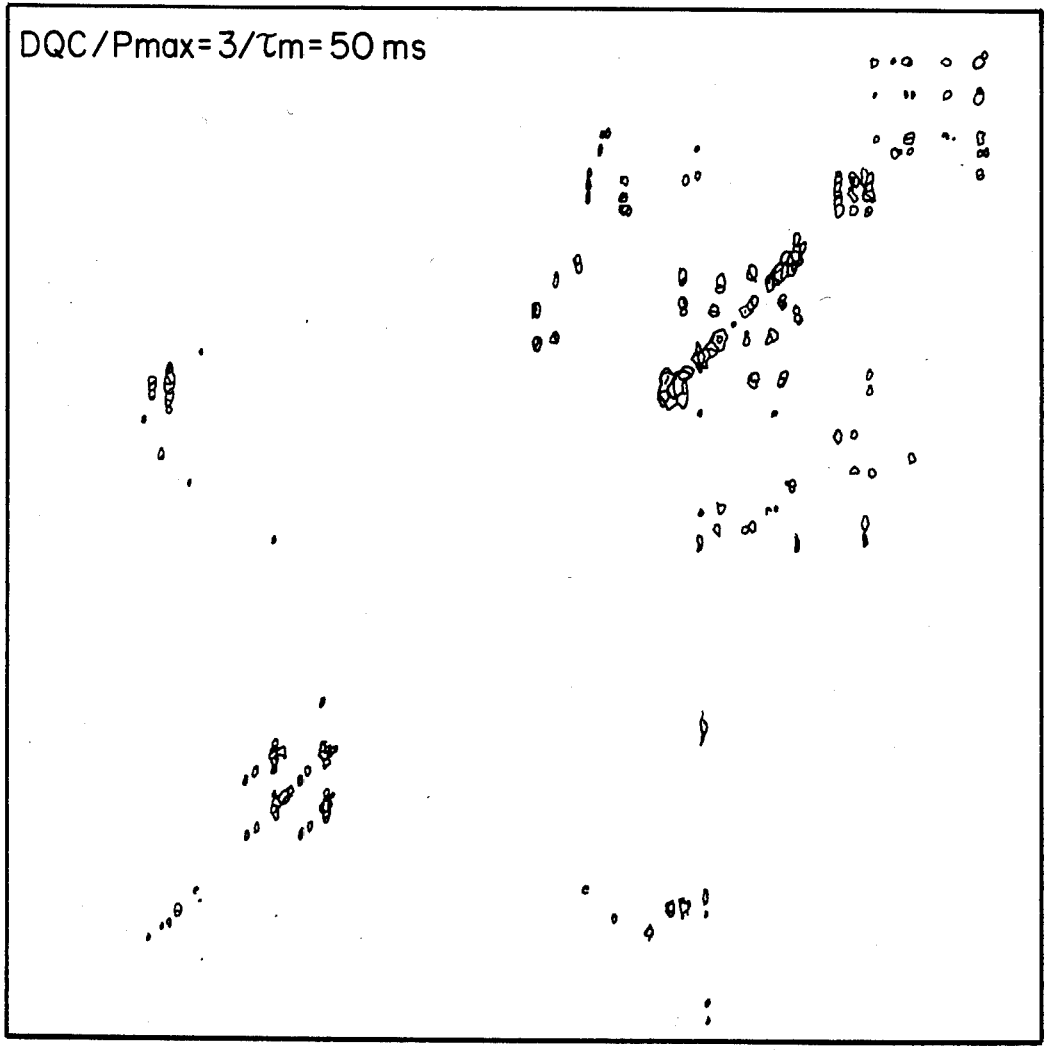
Figure 11:
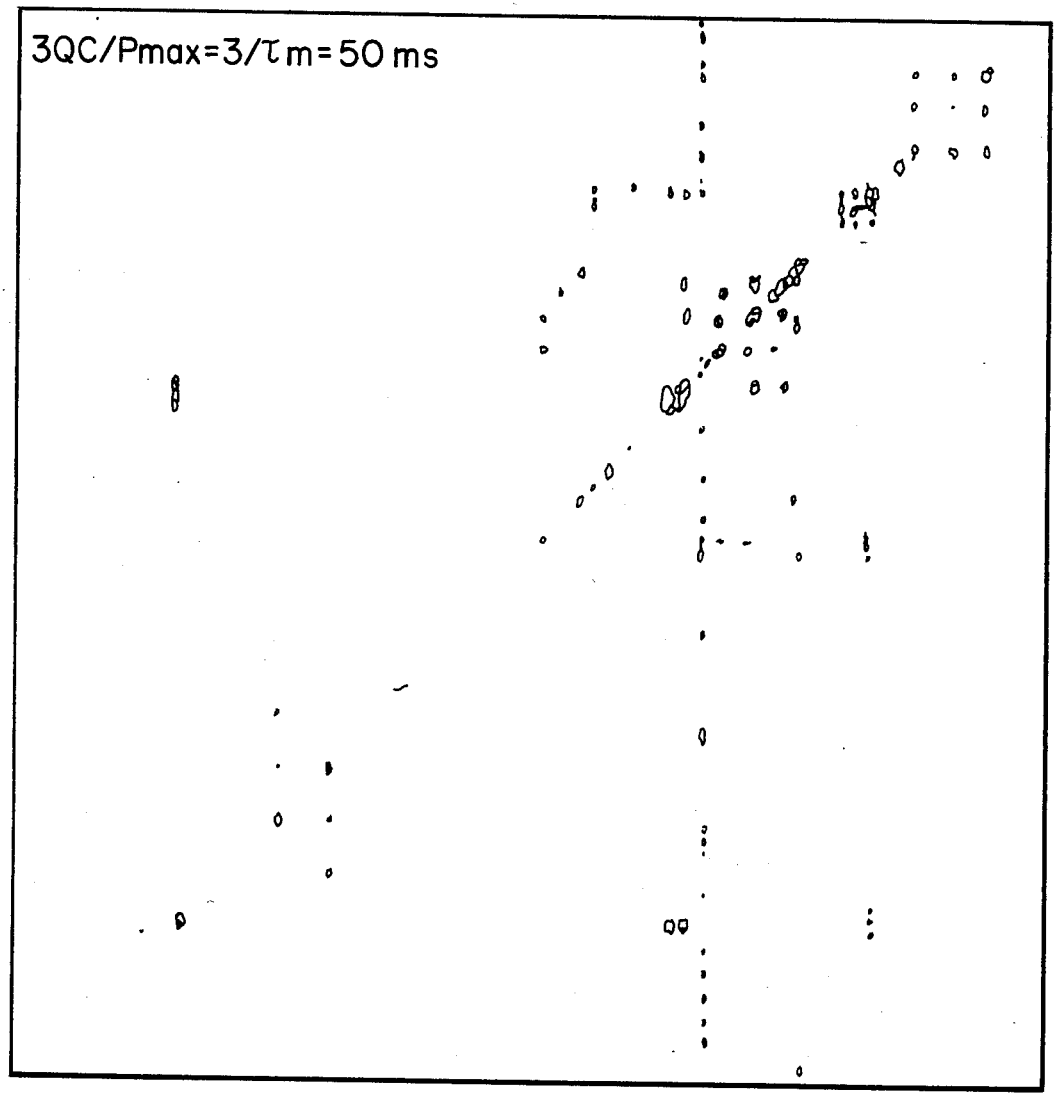

FIG. 8 shows a spectrum that is the superimposition of spectra respectively obtained by NOESY and ZQC-COSY. FIG. 9 shows a spectrum which is the superimposition of spectra respectively obtained by SQC-COSY and relayed COSY. FIG. 10 shows a spectrum derived by DQC-COSY. FIG. 11 shows a spectrum obtained by TQC-COSY.

In this way, four different 2D NMR spectra are obtained by a single series of measurements under the conditions p=0, 1, 2, 3, respectively. Therefore, the time taken to analyze the structure of the sample can be shortened greatly.

Figure 6C:
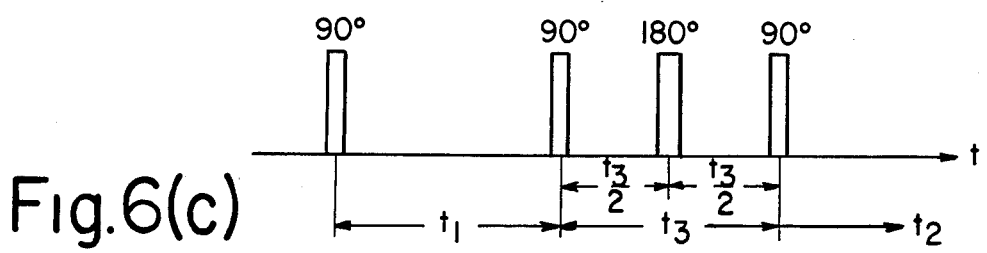
FIG. 6(c) shows a pulse sequence used in a second embodiment of the invention.

FIG. 6(c) shows a pulse sequence used in a second embodiment of the invention. In this embodiment, the mixing period $\tau_m$ is taken as a variable $t_3$ and changed systematically in the same manner as $t_1$. The resulting free induction decay signal is detected during the detection period of $t_2$, and a 3D matrix $S(t_1, t_2, t_3)$ of data is created. In this case, the fundamental response waveform in one experiment is given by $$\cos \omega_n t_1 \cdot \cos J t_3 \cdot S(t_2)$$

Then, the Fourier transform of the obtained data is taken with respect to the time-axes, thus giving rise to data $S(\omega_1, \omega_2, J)$ about a 3D NMR spectrum.

The algorithm by which the spectrum is derived is similar to the algorithm used in the first embodiment except that $\phi$ is replaced by $t_3$. Specifically, complex Fourier transformations are made with respect to $t_1$ and $t_2$ in the same way as in the conventional 2D NMR spectroscopy. A real Fourier transformation, or cosine transformation, is effected with respect to $t_3$, because the sign of J is disregarded. These Fourier transformations are carried out as follows:

$$S(t_1,t_2,t_3) \xrightarrow{t_2\text{-complex FT}} S(t_1,\omega_2,t_3) \xrightarrow{t_1\text{-complex FT}}$$

$$S(\omega_1,\omega_2,t_3) \xrightarrow{t_3\text{-cosine Trans.}} S(\omega_1,\omega_2,J)$$

Figure 12:
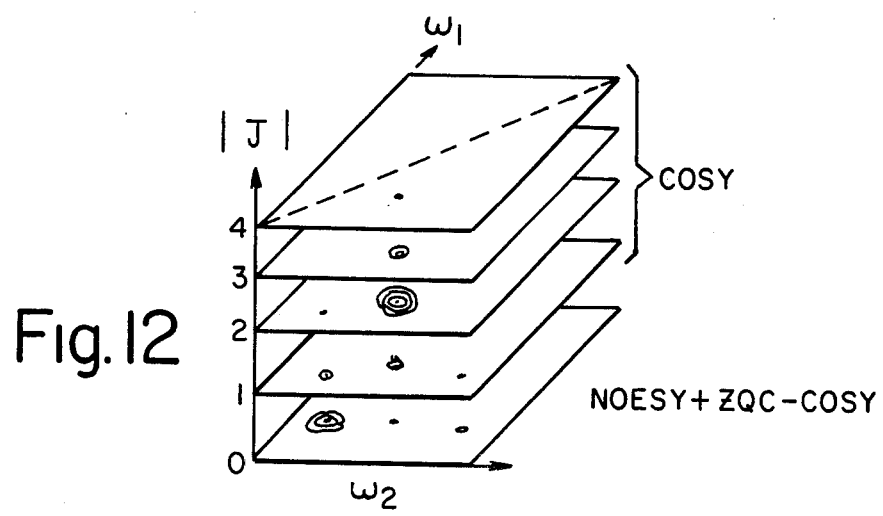
FIG. 12 is a diagram schematically showing a 3D NMR spectrum obtained by the second embodiment of the invention.

Since the resonance frequency conjugate to $t_3$ is only J of the J-coupling, the frequency range of J is narrow compared with $\omega_1$ and $\omega_2$ which evolve during the period $t_1$ and $t_2$, respectively. During these evolution periods $t_1$ and $t_2$, chemical shifts are allowed to evolve. FIG. 12 is a 3D spectrum obtained by the second method of the invention and should be compared with FIG. 7.

Referring to FIG. 12, each 2D plane perpendicular to the J-axis has an individual 2D NMR spectrum. For example, the plane J=0 has a spectrum of the superimposition of spectra respectively obtained by NOESY and ZQC-COSY. Planes J≠0 have spectra obtained by COSY.

The 3D spectrum is projected on the J-$\omega_2$ plane to produce a 2D J-resolved spectrum. Since $t_3$ is changed from zero, the effects of relaxation time $T_2$ are inevitable. Therefore, each peak tails off along the J-axis, which contrasts with a spectrum obtained by the first method where the mixing period is fixed and p-quantum selection is made.

In the case of protons, the magnitude of J is approximately below 15 Hz. For this reason, it suffices to set the number of sampling points, i.e., the number of variation of the period $t_3$ to 16 to 32. According to the Nyquist theorem, the number of stacked 2D spectra is half this number, i.e., 8 to 16.

As described thus far, the present invention permits a plurality of 2D NMR spectra to be obtained by a single series of NMR experiments, i.e., under the same conditions. As a result, the analysis of the structure of a sample can be made without introducing ambiguity, based on various 2D NMR spectra. Further, the analysis can be effected in a short time.

Having thus described our invention with the details and particularity required by the Patent Laws, what is claimed and desired to be protected by Letters Patent is set forth in the following claims.

What is claimed is:

1. A three-dimensional nuclear magnetic resonance spectroscopy comprising the steps of:
    (a) applying a first 90°-pulse to a sample containing gyromagnetic resonators after the lapse of a given preparation period;
    (b) applying a second 90°-pulse to the sample after the lapse of an evolution period of $t_1$ that follows the application of the first 90°-pulse;
    (c) applying a 180°-pulse to the sample at the middle of a mixing period of $T_m$ that follows the application of the second 90°-pulse and applying a third 90°-pulse to the sample after the mixing period of $T_m$;
    (d) detecting the free induction decay signal emanating from the resonators during a detection period of $t_2$ that follows the application of the third 90°-pulse and storing the obtained data in a memory;
    (e) carrying out the steps (a)–(d) while systematically varying the length $t_1$ of the evolution period and a second pulse train parameter X, obtaining the sum $S(t_1, t_2, X)$ of the resulting free induction decay signals, and storing the data in the memory;
    (f) taking the complex Fourier transform of the data $S(t_1, t_2, X)$ with respect to $t_2$;
    (g) taking the complex Fourier transform of the transformed data $S(t_1, \omega_2, X)$ with respect to $t_1$; and
    (h) taking the cosine Fourier transform of the transformed data $S(\omega_1, \omega_2, X)$ with respect to X to obtain a spectrum $S(\omega_1, \omega_2, Y)$.

2. A three-dimensional nuclear magnetic resonance spectroscopy comprising the steps of:
    (a) applying a first 90°-pulse to a sample containing gyromagnetic resonators after the lapse of a given preparation period;
    (b) applying a second 90°-pulse to the sample after the lapse of an evolution period of $t_1$ that follows the application of the first 90°-pulse;
    (c) applying a 180°-pulse to the sample at the middle of a mixing period of $\tau_m$ that follows the application of the second 90°-pulse and applying a third 90°-pulse to the sample after the mixing period of $\tau_m$;
    (d) detecting the free induction decay signal emanating from the resonators during a detection period of $t_2$ that follows the application of the third 90°-pulse and storing the obtained data in a memory;
    (e) carrying out the steps (a)–(d) while systematically varying the length $t_1$ of the evolution period and the RF phases $\phi$ of the first 90°-pulse, the second 90°-pulse, and the 180°-pulse, obtaining the sum $S(t_1, t_2, \phi)$ of the resulting free induction decay signals, and storing the data in the memory;
    (f) taking the complex Fourier transform of the data $S(t_1, t_2, \phi)$ with respect to $t_2$;
    (g) taking the complex Fourier transform of the transformed data $S(t_1, \omega_2, \phi)$ with respect to $t_1$; and
    (h) taking the cosine Fourier transform of the transformed data $S(\omega_1, \omega_2, \phi)$ with respect to $\phi$ to obtain a spectrum $S(\omega_1, \omega_2, p)$.

3. A three-dimensional nuclear magnetic resonance spectroscopy comprising the steps of:
    (a) applying a first 90°-pulse to a sample containing gyromagnetic resonators after the lapse of a given preparation period;
    (b) applying a second 90°-pulse to the sample after the lapse of an evolution period of $t_1$ that follows the application of the first 90°-pulse;
    (c) applying a 180°-pulse to the sample at the middle of a mixing period of $t_3$ after the application of the second 90°-pulse and applying a third 90°-pulse to the sample after the mixing period of $t_3$;
    (d) detecting the free induction decay signal emanating from the resonators during a detection period of $t_2$ that follows the application of the third 90°-pulse and storing the obtained data in a memory;
    (e) carrying out the steps (a)–(d) while systematically varying the length $t_1$ of the evolution period and the length $t_3$ of the mixing period and obtaining the sum $S(t_1, t_2, t_3)$ of the resulting free induction decay signals;
    (f) taking the complex Fourier transform of the data $S(t_1, t_2, t_3)$ with respect to $t_2$;
    (g) taking the complex Fourier transform of the transformed data $S(t_1, \omega_2, t_3)$ with respect to $t_1$; and
    (h) taking the cosine Fourier transform of the transformed data $S(\omega_1, \omega_2, t_3)$ with respect to $t_3$ to obtain a spectrum $S(\omega_1, \omega_2, J)$.

* * * * *